(12) United States Patent
Tanaka et al.

(10) Patent No.: US 7,374,862 B2
(45) Date of Patent: May 20, 2008

(54) PHOTOSENSITIVE RESIN COMPOSITION AND CURING PRODUCT THEREOF

(75) Inventors: Ryutaro Tanaka, Tokyo (JP); Hiroo Koyanagi, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/547,907

(22) PCT Filed: Mar. 4, 2004

(86) PCT No.: PCT/JP2004/002718

§ 371 (c)(1), (2), (4) Date: Sep. 6, 2005

(87) PCT Pub. No.: WO2004/079452

PCT Pub. Date: Sep. 16, 2004

(65) Prior Publication Data

US 2006/0102051 A1  May 18, 2006

(30) Foreign Application Priority Data

Mar. 6, 2003 (JP) .............................. 2003-059309
Jun. 11, 2003 (JP) .............................. 2003-166038

(51) Int. Cl.
*G03F 7/027* (2006.01)

(52) U.S. Cl. ....................... 430/284.1; 522/96; 522/92; 430/18; 430/311

(58) Field of Classification Search .............. 430/284.1
See application file for complete search history.

(56) References Cited

U.S. PATENT DOCUMENTS 4,877,711 A * 10/1989 Aoai et al. .................. 430/176
5,089,376 A * 2/1992 Setthachayanon ........ 430/284.1

FOREIGN PATENT DOCUMENTS

JP          2003-122001 A  *  4/2003

OTHER PUBLICATIONS

Machine English Translation of Japan 2003-122001 (Nippon Kayaku Co Ltd).*

International Search Report for PCT/JP2004/002718 mailed Apr. 20, 2004.
Patent Abstracts of Japan for JP2002-338652 published Nov. 27, 2002.
Patent Abstracts of WO 02/23273 A2 published Mar. 21, 2002.
Patent Abstracts of Japan for JP2001-159815 published Jun. 12, 2001.
Patent Abstracts of Japan for JP2001-083699 published Mar. 30, 2001.
Patent Abstracts of Japan for JP2001-033960 published Feb. 9, 2001.
Patent Abstracts of Japan for JP2001-033959 published Feb. 9, 2001.
Patent Abstracts of Japan for JP09-052925 published Feb. 25, 1997.
Patent Abstracts of Japan for JP02-232217 published Sep. 14, 1990.
Patent Abstracts of Japan for JP01-255854 published Oct. 12, 1989.
Patent Abstracts of Japan for JP61-243869 published Oct. 30, 1986.
Patent Abstracts of japan for JP05-032746 published Feb. 9, 1993.

* cited by examiner

*Primary Examiner*—Cynthia Hamilton
(74) *Attorney, Agent, or Firm*—Darby & Darby P.C.

(57) ABSTRACT

A photosensitive resin composition that excels in sensitivity to actinic energy rays (photosensitivity), is hardenable within a short period of time and can form pattern through development with a diluted aqueous alkali solution and that gives a cured film through thermal curing in the postcuring step, the cured film having satisfactory flexibility and being suitable to a solder mask ink of high insulation excelling in adherence and resistances of gold plating, electroless gold plating and tin plating; and a curing product thereof. In particular, a photosensitive resin composition characterized by comprising (1) a urethane resin (A) soluble in aqueous alkali solutions, the urethane resin obtained by urethanizing in the absence of catalyst a diisocyanate compound (a), a diol compound having an ethylenically unsaturated group in its molecule (b) and a diol compound having a carboxyl group in its molecule (c) optionally together with a diol compound not having any ethylenically unsaturated group or carboxyl group in its molecule (d) and reacting the reaction product with a cyclic acid anhydride (e); (2) photopolymerization initiator (B); and (3) a reactive crosslinking agent (C).

22 Claims, No Drawings

PHOTOSENSITIVE RESIN COMPOSITION AND CURING PRODUCT THEREOF

Cross-Reference to Prior Application

This is a U.S. national phase application under 35 U.S.C. §371 of International Patent Application No. PCT/JP2004/002718 filed Mar. 4, 2004, and claims the benefit of Japanese Patent Application Nos. 2003-59309 filed Mar. 6, 2003 and 2003-166038 filed Jun. 11, 2003, both of which are incorporated by reference herein. The International Application published in Japanese on Sep. 16, 2004 as WO 2004/079452 A1 under PCT Article 21(2).

BACKGROUND OF THE INVENTION

1. Field of the Invention

The present invention relates to a photosensitive resin composition using a polyurethane resin which is obtained by urethanization reaction without any catalyst followed by reaction with a cyclic acid anhydride and is soluble in aqueous alkali solution, and a manufacturing method of the curing product thereof. More specifically, the present invention relates to a resin composition to provide a curing product having excellent properties including such as developing property, flexibility, adhesion property, soldering heat resistance, chemical resistance, plating resistance and high insulation, etc. is useful for such as a solder mask for flexible print wiring board; an insulation film between layers for multilayer print wiring board; photosensitive light guide; and a manufacturing method of a curing product thereof; and to provide a base material and the like having a layer of the curing product.

2. Description of the Related Art

Conventionally, some part of print wiring board for personal use and most of print wiring board for industrial use are solder masks utilizing photolithograph. More specifically, an image is created by developing treatment after curing with exposure, and a photocuring composition which is finished with hardening with further heat and/or photo irradiation is used. A liquid composition for solder mask, which is a kind of alkali development using a diluted aqueous alkali solution as a developing solution, is mainly used because of environmental concerns. For example, a solder mask composition, as a liquid composition for solder mask which is an alkali development-type and uses a diluted aqueous alkali solution, comprising a photosensitive resin which is produced by addition of acid anhydride to the reaction product of novolac type epoxy resin and an unsaturated monobasic acid, a photopolymerization initiator, a crosslinking agent, and an epoxy resin has been disclosed. (Reference Patent 1, etc.) The curing product of the composition, however, is hard so that when it is applied to a Ball Grid Array (BGA) base board and a flexible base board, which recently are being used in many fields including portable equipments, unfortunately it causes a crack on the surface or it cannot afford a bending property.

Another composition including such as a polybasic acid anhydride modified epoxy acrylate resin produced by the reaction of the polybasic acid anhydride and the reaction product of polyfunctional bisphenol epoxy resin and (meth)acrylic acid, and an urethane acrylate has been disclosed as a material applicable to a BGA base board or a flexible base board in Reference Patent 2. When this is used, it cannot yet afford satisfactory flexibility and it cannot follow against extreme bending even though durability against cracking on the surface is improved.

Further, another resin composition which includes a urethane resin containing unsaturated group produced by a reaction of an unsaturated resin containing hydroxy group, which is produced by a reaction of 0.8 to 1.2 mole of an ethylenically unsaturated carboxylic acid having average molecular weight between 72 and 1000 containing average one carboxylic group and average one ethylenically unsaturated group in one molecule to one mole of epoxy group of diepoxide; a diol compound containing a carboxyl group; a diisocyanate compound; and a polyol compound as appropriate; has been disclosed in Reference Patent 3 and 4. However, if molecular weight is increased, the acid value of the resin also increases in a basis of resin design, and if a content of an ethylenically unsaturated group is increased to increase sensitivity, the acid value of the resin decreases, and therefore, because of such reason, it is difficult to get a well balanced molecular weight, sensitivity and developing property, and an optimization of the solder mask composition is problematic.

Photopolymeric resin composition which includes a urethane modified acid additional vinylester resin obtained by addition of polybasic acid anhydride to an urethane modified vinylester resin composed of vinylester resin obtained by a reaction of an epoxy compound including more than 1.2 epoxy group in one molecule and unsaturated monobasic acid has been disclosed in Reference Patent 5, but it has problematic electric property such as poor insulation property of its curing product, because urethane modified vinylester resin is produced by using a catalyst when the urethane is produced.

[Reference Patent 1] Japanese Laid Open Patent S61-243869
[Reference Patent 2] Japanese Patent 2868190
[Reference Patent 3] Japanese Laid Open Patent 2001-33959
[Reference Patent 4] Japanese Laid Open Patent 2001-33960
[Reference Patent 5] Japanese Laid Open Patent H9-52925

A highly precise and highly condensed print wiring board is demanded to minimize the size of portable equipment and increase communication speed. Accordingly higher grade solder mask is also demanded with maintaining more flexible property to increase electric properties such as gold plating resistance, electroless gold plating resistance, tin plating resistance, board adhesion property and high insulation property. Nonetheless the present known solder mask cannot satisfy these demands.

OBJECTS AND SUMMARY OF THE INVENTION

An object of the present invention is to provide a resin composition and a curing product thereof which are optimal to such as a reliable solder mask ink, which has an excellent photosensitivity to actinic energy rays which can draw a fine image responsible to high functions of a present print wiring board; wherein a pattern formation can be carried out by development with a diluted aqueous alkali solution and hardened film obtained by thermal curing as postcuring (postcure) process has satisfactory flexibility, high insulation, adhesion properties, gold plating resistance, electroless gold plating resistance, tin plating resistance, and prevention of peeling-off or swelling; especially a solder mask for flexible print wiring board, a insulation film between layers for polylayered print wiring board and a photosensitive light guide.

The inventors researched eagerly to carry out the above objects and completed the present invention.

Specifically, the present invention includes, (1) a photosensitive resin composition comprising;
(i) urethane resin (A) soluble in aqueous alkali solution obtained by a urethanization reaction, without any catalyst, of a diisocyanate compound (a), a diol compound (b) having an ethylenically unsaturated group in its molecule; a diol compound (c) having a carboxyl group in its molecule; and a diol compound (d) not having any ethylenically unsaturated group or carboxyl group in its molecule as an optional component; and a reaction with a cyclic acid anhydride (e);
(ii) photopolymerization initiator (B); and
(iii) a reactive cross-linking agent (C).
Another present invention includes,
(2) the photosensitive resin composition according to (1) comprising; a curing component (D) as an optional component.
Another present invention includes;
(3) the photosensitive resin composition according to (1) or (2), wherein the solid-component acid value of the urethane resin (A) soluble in aqueous alkali solution is in the range of 30 to 150 mgKOH/g.
Another present invention includes;
(4) the photosensitive resin composition according to any one of (1) to (3), wherein the diol compound (b) having the ethylenically unsaturated group in its molecule is a reaction product of an epoxy compound having two epoxy groups in its molecule and (meth)acrylic acid or cinnamic acid; and the cyclic acid anhydride (e) is dibasic acid monoanhydride and/or tribasic acid monoanhydride.
Another present invention includes;
(5) the photosensitive resin composition according to any one of (1) to (4), wherein the diisocyanate compound (a) is isophorone diisocyanate and/or trimethylhexamehylene diisocyanate; the diol compound (b) having the ethylenically unsaturated group in its molecule is the reaction product of bisphenol A type epoxy resin and (meth)acrylic acid; the diol (c) having the carboxyl group in its molecule is dimethylol propionic acid; and the cyclic acid anhydride (e) is succinic anhydride.
Another present invention includes;
(6) the photosensitive resin composition according to (1) or (2), wherein the urethane resin (A) soluble in aqueous alkali solution is obtained by adding trimethylhexamethylene diisocyanate to a mixture of dimethylol propionic acid and the reaction product of bisphenol A type epoxy resin and methacrylic acid, and then reacting with succinic anhydride.
Another present invention includes;
(7) the photosensitive resin composition according to (5) or (6), wherein the epoxy equivalent of the bisphenol A type epoxy resin is in the range of 100 to 900 g/equivalent.
Another present invention includes;
(8) the photosensitive resin composition according to (6), wherein an equivalent ratio, in the reaction to obtain the urethane resin (A) soluble in aqueous alkali solution, of a hydroxyl group in a mixture of dimethylol propionic acid and the reaction product of bisphenol A type epoxy resin and methacrylic acid, to isocyanate group of trimethylhexamethylene diisocyanate is in the range of 1.1 to 2.0.
Another present invention includes;
(9) a manufacturing method of a curing product comprising; irradiating actinic energy rays on the photosensitive resin composition according to any one of (1) to (8).
Another present invention includes;
(10) a base material having a layer of the curing product produced by the manufacturing method according to (9).
Another present invention includes;
(11) a product having the base material according to (10).
Another present invention includes;
(12) a manufacturing method of a solder mask for a flexible print wiring board, of a insulation film between layers for a multilayer print wiring board, or of a photosensitive light guide, comprising the steps of; a coating process of a photosensitive resin composition according to any one of (1) to (8); an irradiating process of actinic energy rays for curing, and a treating process with alkali and/or heat.

DETAILED DESCRIPTION OF PREFERRED EMBODIMENTS

A photosensitive resin composition of the present invention comprises urethane resin (A) soluble in aqueous alkali solution obtained by a urethanization reaction of (i) diisocyanate compound (a); diol compound (b) having an ethylenically unsaturated group in its molecule; diol compound (c) having a carboxyl group in its molecule; diol compound (d) not having any ethylenically unsaturated group or carboxyl group in its molecule as an optional component without any catalyst, and a reaction with a cyclic acid anhydride (e); (ii) photopolymerization initiator (B); and (iii) reactive cross-linking agent (C).

Diisocyanate compound (a) used in the production of urethane resin (A) soluble in aqueous alkali solution in a photosensitive resin composition of the present invention is not particularly limited if it has two isocyanate groups in its molecule, and plural diisocyanates can be used at the same time. Especially, from such a excellent flexibility standpoint of view, as the diisocyanate compound (a), phenylene diisocyanate, tolylene diisocyanate, xylylene diisocyanate, tetramethylxylylene diisocyanate, diphenylmethane diisocyanate, naphthalene diisocyanate, toludene diisocyanate, hexamethylene diisocyanate, dicyclohexylmethane diisocyanate, isophorone diisocyanate, allylenesulfonether diisocyanate, allylcyan diisocyanate, N-acyl diisocyanate, trimethylhexamethylene diisocyanate, 1,3-bis-(isocyanatomethyl)cyclohexane or norbornan diisocyanate can be used, and further preferably isophorone diisocyanate or trimethylhexamethylene diisocyanate can be used.

Diol compound (b), having an ethylenically unsaturated group, used in the production of urethane resin (A) soluble in aqueous alkali solution in the photosensitive resin composition of the present invention is preferably the reaction product of an epoxy compound having two epoxy groups in its molecule and (meth)acrylic acid or cinnamic acid, and more preferably the reaction product of bisphenol A type epoxy resin or hydrogenated bisphenol A type epoxy resin and (meth)acrylic acid. Diol compound having an ethylenically unsaturated group in its molecule, for example, such as the reaction product of dimethylol propionic acid and 2-hydroxyethyl (meth)acrylate, the reaction product of dimethylol propionic acid and 2-hydroxypropyl (meth)acrylate, the reaction product of dimethylol butanoic acid and 2-hydroxyethyl (meth)acrylate, the reaction product of dimethylol butanoic acid and 2-hydroxypropyl (meth)acrylate, the reaction product of an epoxy compound having two epoxy groups in its molecule and (meth)acrylic acid or cinnamic acid, and the reaction product of a phenolic compound having two phenolic hydroxyl groups in its molecule and glycidyl (meth)acrylate.

Epoxy compound having two epoxy groups in its molecule, for example, is phenyl diglycidyl ether such as hydroquinone diglycidyl ether, catechol diglycidyl ether, resorcinol diglycidyl ether; bisphenol type epoxy compound such as bisphenol A type epoxy resin, bisphenol F type epoxy resin, bisphenol S type epoxy resin, epoxy compound of 2,2-bis(4-hydroxyphenyl)-1,1,1,3,3,3-hexafluoropropane; hydrogenated bisphenol type epoxy compound such as hydrogenated bisphenol A type epoxy resin, hydrogenated bisphenol F type epoxy resin, hydrogenated bisphenol S type epoxy resin, epoxy compound of hydrogenated 2,2-bis (4-hydroxyphenyl)-1,1,1,3,3,3-hexafluoroporpane; halogenated bisphenol type epoxy compound such as brominated bisphenol A type epoxy resin, brominated bisphenol F type epoxy resin; acyclic diglycidyl ether compound such as cyclohexanedimethanol diglycidyl ether; liphatic diglycidyl ether such as 1,6-hexanediol diglycidyl ether, 1,4-butanediol diglycidyl ether, diethyleneglycol diglycidyl ether; polysulfide type diglycidyl ether compound such as polysulfide diglycidyl ether; and biphenol type epoxy resin.

Phenol compound having two phenolic hydroxy groups in its molecule is, for example, such as hydroquinone, catechol, resorcinol, bis(4-hydroxyphenyl)ketone, bis(4-hydroxy-3,5-dimethylphenyl)ketone, bis(4-hydroxy-3,5-dichlorophenyl) ketone, bis(4-hydroxypheny)lsulfone, bis(4-hydroxy-3,5-dimethylphenyl)sulfone, bis(4-hydroxy-3,5-dichlorophenyl) sulfone, bis(4-hydroxyphenyl)hexafluoropropane, bis(4-hydroxy-4,5-dimethylphenyl)hexafluoropropane, bis(4-hydroxy-3,5-dichlorophenyl)hexafluoropropane, bis(4-hydroxyphenyl)dimethylsilane, bis(4-hydroxy-3,5-dimethylphenyl)dimethylsilane, bis(4-hydroxy-3,5-dichlorophenyl)dimethylsilane, bis(4-hydroxyphenyl) methane, bis(4-hydroxy-3,5-dichlorophenyl)methane, bis(4-hydroxy-3,5-dibromophenyl)methane, 2,2-bis(4-hydroxyphenyl)propane, 2,2-bis(4-hydroxy-3,5-dimethylphenyl)propane, 2,2-bis(4-hydroxy-3,5-dichlorophenyl)propane, 2,2-bis(4-hydroxy-3-methylphenyl)propane, 2,2-bis(4-hydroxy-3-chlorophenyl) propane, bis(4-hydroxyphenyl)ether, bis(4-hydroxy-3,5-dimethylphenyl)ether, bis(4-hydroxy-3,5-dichlorophenyl) ether, 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl) fluorene, 9,9-bis(4-hydroxy-3-fluorophenyl)fluorene, 9,9-bis(hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, 4,4'-biphenol, and 3,3'-biphenol.

The reaction product of bisphenol A type epoxy resin and methacrylic acid is further preferable as diol compounds (b) having an ethylenically unsaturated group in its molecule used in the production of urethane resin (A) soluble in an aqueous alkali solution in a photosensitive resin composition of the present invention. Methacrylic acid is selected from sensitivity standpoint in obtaining a curing product by actinic energy rays irradiation and flexibility standpoint of curing product.

As a bisphenol A type epoxy resin, more preferably the epoxy resin has the epoxy equivalent in the range of 100 to 900 g/equivalent. If the epoxy equivalent is less than 100, a film may not be formed or its flexibility may not be satisfactory because the molecular weight of urethane resin (A) soluble in aqueous alkali solution produced is small, and further if the epoxy equivalent is more than 900, the photosensitivity (light sensitivity) may decrease because an introduction ratio of methacrylic acid decreases.

The epoxy equivalent of the present invention means the same as a traditional one, and specifically it is a mass of the epoxy compound containing 1 g equivalent epoxy group. It is expressed as g/equivalent and measured by the method as directed to JIS K7236.

Bisphenol A type epoxy resin used in the production of urethane resin (A) soluble in aqueous alkali solution in the photosensitive resin composition of the present invention includes, for example but not limited, such as commercial Epikote 828, Epikote 1001, Epikote 1002, Epikote 103 and Epikote 1004 (manufactured by Japan Epoxy Resin Co., Ltd.); Epomic R-140, Epomic R-301 and Epomic R-304 (manufactured by Mitsui Chemical Co., Ltd.); D. E. R-331, D. E. R-332 and D. E. R-324 (manufactured by Dow Chemical Co., Ltd.); Epiclon 840 and Epiclon 850 (manufactured by Dainippon Ink Co., Ltd.); UVR-6410 (manufactured by Union Carbide Corporation); and TD-8125 (manufactured by Toto Kasei Co., Ltd.). And bisphenol A type epoxy resin having no alcoholic hydroxy group, for example such as RE310S (manufactured by Nippon Kayaku Co., Ltd.), is especially preferable.

A ratio of the starting materials in the reaction of bisphenol A type epoxy resin and methacrylic acid is preferably in the range of 80 to 120 equivalent % of methacrylic acid to 1 equivalent of the epoxy group of bisphenol A type epoxy resin. If it is out of the range, gel formation may occur while the second reaction or heat stability of urethane resin (A) soluble in aqueous alkali solution as the final product may decrease.

A use of catalyst in the reaction is preferred to increase the reaction rate, and an amount of the catalyst is in the range of 0.1 to 10% by weight of the reaction product. A catalyst as specific example is such as triethylamine, benzyldimethylamine, triethylammonium chloride, benzyltrimethylammonium bromide, benzyltrimethylammonium iodide, triphenylphosphine, triphenylstibine, methyltriphenylstibine, chromium octanoate, and zirconium octanoate, The reaction temperature is in the range of 60 to 150° C., and the reaction time is in the range of approximately 5 to 60 hours even though the reaction time can be determined case by case by monitoring the acid value, which will be explained later.

A thermal polymerization inhibitor used is preferably hydroquinone monomethyl ether, 2-methylhydroquinone, hydroquinone, diphenylpicrylhydrazine, diphenylamine or 2,6-di-tert-butyl-p-cresol.

The end point is the time when the acid value of the reaction solution is not more than 1 mgKOH/g and preferably not more than 0.5 mgKOH/g.

The solid-component acid value of the present invention is an amount (mg) of potassium hydroxide required to neutralize acidity of carboxylic acid in 1 g of resin, and the acid value is an amount (mg) of potassium hydroxide required to neutralize 1 g of the solution containing the resin, which can measured by using the standard neutralization titration method as directed to JIS K0070. Also, if a concentration of the resin in the solution is known, the solid-component acid value can be obtained by calculation from the acid value of the solution.

Diol compound (c) having a carboxyl group in its molecule used in the production of urethane resin (A) soluble in aqueous alkali solution in the photosensitive resin composition of the present invention is a compound in which there are two alcoholic hydroxy groups and more than one carboxylic group in the same molecule, and is more preferably dimethylol propionic acid and dimethylol butanoic acid (2,2-bis(hydroxymethylbutanoic acid), but not limited, which have an excellent solubility in an aqueous alkali solution used as a development solution of the composition.

Diol compound (d) as an optional component used in the production of urethane resin (A) soluble in aqueous alkali solution in the photosensitive resin composition of the present invention is an aliphatic diol compound or alicyclic diol compound which has no ethylenically unsaturated group or no carboxyl group, and in which two alcoholic hydroxy groups are not attached to the same carbon. Such diol compound is, for specific example, such as (poly)ethylene glycol, (poly)propylene glycol, trimethylene glycol, 1,4-butanediol, 1,5-pentanediol, 1,6-hexanediol, 1,7-heptanediol, 1,8-octanediol, 1,9-nonanediol, 1,10-decanediol, hydrobenzoin, benzpinacol, cyclopentane-1,2-diol, cyclohexane-1,2-diol, cyclohexane-1,4-diol, cyclohexane-1,2-dimethanol, cyclohexane-1,4-dimethanol, a butadiene-acrylonitrile copolymer having a bydroxy group at its end (e.g. ATX013 manufactured by Ube Kosan Co., Ltd.), a spiro glycol having a hydroxyl group at its end (e.g. 3,9-bis(2-hydroxy-1,1-dimethylethyl)-2,4,8,10-tetraoxaspiro[5,5]undecane, a dioxane glycol having a hydroxyl group at its end (e.g. 2-(2-hydroxy-1,1-dimethylethyl)-5-ethyl-5-hydroxy-1,3-dioxane); a tricyclodecane dimethanol having a hydroxyl group at its end, a macromonomer having a hydroxyl group at its end and a polystyrene side chain (e.g. HS-6 manufactured by Toa Gousei Co., Ltd.), hydrogenated bisphenol A, hydrogenated bisphenol F, and a reaction product of these diol compounds and an oxide such as ethylene oxide or propylene oxide.

Cyclic acid anhydride (e) used in the production of urethane resin (A) soluble in aqueous alkali solution in the photosensitive resin composition of the present invention is a dibasic acid monoanhydride in which the dibasic acid forms an intramolecular acid anhydride, a tribasic acid monoanhydride in which two carboxylic groups of the tribasic acid form an intramolecular anhydride, or a mixture of such acid monoanhydride. The dibasic acid monoanhydride, for example, is such as maleic anhydride, succinic anhydride, itaconic anhydride, phthalic anhydride, tetrahydrophthalic anhydride, hexahydrophthalic anhydride, methyl endmethylene tetrahydrophthalic anhydride, methyltetrahydrophthalic anhydride; and more preferably phthalic anhydride and tetrahydrophthalic anhydride. The tribasic acid anhydride, for example, is such as trimellitic anhydride, tetrahydrotrimellitic anhydride, hexahydrotrimellitic anhydride and more preferably trimellitic anhydride.

Especially, urethane resin (A) soluble in aqueous alkali solution produced by using succinic anhydride (d) has an excellent developing property.

Urethane resin (A) soluble in aqueous alkali solution used for the photosensitive resin composition of the present invention can be, for example, synthesized following procedures; premix diol compound (b) having an ethylenically unsaturated group in its molecule, diol compound (c) having a carboxyl group in its molecule, optional diol compound (d) not having any ethylenically unsaturated group or carboxyl group in a predetermined ratio in no solvent or in single or mixed solvent having no alcoholic hydroxyl group, for example, a ketone-type solvent such as acetone, methyl ethyl ketone and cyclohexanone; an aromatic hydrocarbon such as benzene, toluene, xylene and tetramethylbenzene; a glycol ether such as ethylene glycol dimethyl ether, ethylene glycol diethyl ether, dipropylene glycol monomethyl ether, dipropylene glycol dimethyl ether, dipropylene glycol diethyl ether, trimethylene glycol dimethyl ether and trimethylene glycol diethyl ether; an ester such as ethyl acetate, butyl acetate, methyl cellosolve acetate, ethyl cellosolve acetate, butyl cellosolve acetate, carbitol acetate, propylene glycol mono methyl ether acetate, dialkyl glutarate (e.g. dimethyl glutarate), dialkyl succinate (e.g. dimethyl succinate), and dialkyl adipate (e.g. dimethyl adipate); a cyclic ester such as γ-butyrolactone; a petroleum solvent such as petroleum ether, petroleum naphtha, hydrogenated naphtha and solvent naphtha; reactive crosslinking agent (C), which is explained later; heat, if needed; add gradually diisocyanate compound (a); and carry out an urethanization reaction (the first reaction) without any catalyst such as an organometallic compound, dibutyltin dilaurate, etc.; then react a cyclic acid anhydride (e) to remaining alcoholic hydroxyl group (the second reaction).

An amount of diol compound (c) having a carboxyl group in its molecule added and reacted, as the amount of each component in the first reaction, is a calculated amount to make 10 to 120 mgKOH/g of the solid-component acid value at the end of reaction.

Further an amount of diisocyanate compound (a) in the first reaction is preferably in the range of 1 to 5 of the value which is obtained by dividing the total number of mole of compound (b), compound (c) and compound (d) with the number of mole of compound (a). If the value is less than 1, isocyanate group is remained at the end of the compound obtained on the end of the first reaction so that it is not preferable because gel formation may occur. Further if the value is more than 5, the molecular weight of urethane resin (A) soluble in aqueous alkali solution decreases so that an issue regarding a tacking property and a low sensitivity problem to actinic energy rays may easily occur.

Specifically the first reaction is an urethanization reaction in which dimethylol propionic acid is added to the reaction solution of bisphenol A type epoxy resin and methacrylic acid and after making a suspension or a solution, trimethylhexamethylene diisocyanate and/or isophorone diisocyanate is gradually added.

The first reaction is carried out at temperature in the range of 40 to 120° C. and for a period of time in the range of approximately 5 to 60 hours which is properly determined from IR (Infrared) spectra, described later, being monitored. The above described heat polymerization inhibitor for the reaction of bisphenol A type epoxy resin and methacrylic acid can be used.

When the absorption at 2250 $cm^{-1}$ of IR spectrum assigned to isocyanate group is disappeared, it is the end point of the reaction.

In the first reaction, an amount of trimethylhexamethylene diisocyanate (a') is preferably set as the equivalent ratio of hydroxyl group in the mixture of the reaction product (b') of bisphenol A type epoxy resin and methacrylic acid, and dimethylol propionic acid (c') to isocyanate group of trimethylhexamethylene diisocyanate (a') is in the range of 1.1 to 2.0. Specifically if the bisphenol A type epoxy resin has no alcoholic hydroxyl group, an equivalent ratio can be obtained from the formula, the number of moles of compound (b')+the number of moles of compound (c')/the number of moles of compound (a'). When the value is not more than 1.1, isocyanate group at the end of urethane resin (A) soluble in aqueous alkali solution is left over, it is not preferred because heat stability is poor and gel formation may occur during storage. When the value is more than 2, molecular weight of urethane resin (A) soluble in aqueous alkali solution becomes small so that a tacking property issue for the curing product and a problem of lowering photosensitivity to actinic energy rays on curing.

The second reaction is the reaction in which the cyclic anhydride (e) is added to alcoholic hydroxy group at the end of the reaction product obtained by the first reaction. The alcoholic hydroxy group is remained at the end of the compounds produced under the above condition, to which, for example, dibasic acid monoanhydride and/or tribasic acid monoanhydride specifically succinic anhydride is reacted to produce a semiester so that the acid value effecting developing property can be controlled if a curing component (D), which will be explained later, is contained, it reacts with the semiester so that molecular weight increases linearly and/or laddery to increase heat resistance of the composition.

An amount of cyclic anhydride (e) is applied less than the equivalent of the hydroxy group remained in the first reaction, and as the solid-component acid value of urethane resin (A) soluble in aqueous alkali solution preferably fits in the range of 30 to 150 mgKOH/g. If this solid-component acid value is not more than 30 mgKOH/g, solubility of the photosensitive resin composition in aqueous alkali solution extremely decreases so that, in the worst case, developing treatment cannot be carried out and accordingly patterning cannot be carried out. In contrast, if the solid-component acid value is more than 150 mgKOH/g, solubility in aqueous alkali solution becomes so high that undesirably adhesion property decreases and peeling-off of pattern is easily defected.

In the second reaction, a catalyst can be used to increase reactivity of cyclic acid anhydride (e), especially dibasic acid monoanhydride and/or tribasic acid monoanhydride and alcoholic hydroxy group. Specific example of such catalyst is triethylamine, 4-dimethylaminopyridine, benzyldimethylamine, triethylammonium chloride, benzyltrimethylammonium bromide, benzyltrimethylammonium iodide, triphenylphosphine, trimethylphosphine, diphenylsulfide and dimethylsulfide, etc. Reaction temperature is preferably in the range of 60 to 130° C.

Each amount of dimethylol propionic acid and succinic acid in the reaction is calculated as solid-component acid value of urethane resin (A) soluble in aqueous alkali solution of the present invention fits in the range of 30 to 150 mgKOH/g and is applied. If the solid-component acid value is not more than 30 mgKOH/g, solubility in aqueous alkali solution is not satisfactory and when pattering is carried out, it would be remained as a residue and, in the worse case, patterning cannot be carried out. Further, if solid-component acid value is more than 150 mgKOH/g, solubility in aqueous alkali solution becomes so high that pattern cured by light may be undesirably peeled off.

Content of urethane resin (A) soluble in aqueous alkali solution used for the photosensitive resin composition of the present invention is normally in the range of 15 to 70% by weight and preferably in the range of 20 to 60% by weight of solid part of the photosensitive resin composition.

If solvent is used in the production of the urethane resin (A) soluble in aqueous alkali solution, after removing the solvent using a proper method and isolating it applies in a photosensitive resin composition, but also it can be used as a solution without removing the solvent.

Of course urethane resin (A) soluble in aqueous alkali solution used in the present invention is soluble in aqueous alkali solution, but also it is soluble in organic solvent usable in the above production, and when it is used as a solder resist or a plating resist, it can be developed with the solvent.

A photosensitive resin composition of the present invention comprises urethane resin (A) soluble in aqueous alkali solution, photopolymerization initiator (B), reactive crosslinking agent (C), and further comprises optional curing component (D).

All chemicals generally used for photopolymerization curing can be used as photopolymerization initiator (B) in the photosensitive resin composition of the present invention. Specifically, these are a benzoin compound such as benzoin, benzoin methyl ether, benzoin ethyl ether, benzoin propyl ether, benzoin isopropyl ether, and benzoin isobutyl ether; an acetophenone compound such as acetophenone, 2,2-diethoxy-2-phenylacetophenone, 1,1-dichloroacetophenone, 2-hydroxy-2-methylphenylpropan-1-one, diethoxyacetophenone, 1-hydroxycyclohexyl phenyl ketone, and 2-methyl-1-(4-(methylthio)phenyl)-2-morphorinopropan-1-one; an anthraquinone compound such as 2-ethylanthraquinone, 2-tert-butylanthraquinone, 2-chloroanthraquinone, and 2-amylanthraquinone; a thioxanthone compound such as 2-4,-diethylthioxanthone, 2-isoprpylthioxanthone, and 2-chlorothioxanthone; a ketal compound such as acetophenone dimethyl ketal, and benzyl dimethyl ketal; a benzophenone compound such as benzophenone, 4-benzoyl-4'-methyl-diphenylsufide and 4,4'-bismethylaminobenzophenone; a phosphine oxide compound such as 2,4,6-trimethylbenzoyldiphenylphosphine oxide, and bis(2,4,6-trimethylbenzoyl)phenylphosphine oxide. A content ratio of photopolymerization initiator (B) is generally in the range of 1 to 30% by weight and preferably in the range of 2 to 25% by weight of solid part, as 100% by weight, of the photosensitive resin composition. These compounds can be used as single compound or a mixture of more than two kinds of compound, and further can be used with a reaction promoting agent, a tertiary amine such as triethanolamine and methyldiethanolamine; or a benzoic acid derivative such as N,N-dimethylaminobenzoic acid ethyl ester and N,N-dimethylaminobenzoic acid isoamyl ester. A proper amount of the reaction promoting agent is less than 100% by weight of photopolymerization initiator (B), and it can be used if need.

Reactive Cross-linking agent (C) used for a photosensitive resin composition of the present invention is a (meth) acrylate derivative, i.e. such as 2-hydroxyethyl (meth)acrylate, 2-hydroxypropyl (meth)acrylate, 1,4-butanediol mono (meth)acrylate, carbitol (meth)acrylate, acryloyl morpholine, a semiester which is a reaction product of (meth)acrylate having hydroxy group and polycarboxylic acid anhydride, polyethylene glycol di(meth)acrylate, tripropylene glycol di(meth)acrylate, trimethylol propane polyethoxytri(meth)acrylate, glycerine polypropoxytri(meth) acrylate, di(meth)acrylate which is a reaction product of hydroxypivalic acid neopentylglycol and ε-caprolactone (e.g. Kayarad HX-220 and HX-620, manufactured by Nippon Kayaku Co., Ltd.), pentaerythrytol tetra(meth)acrylate, poly(meth)acrylate which is a reaction product of dipentaerytlirytol and ε-caprolatone, and epoxy (meth)acrylate which is a reaction product of mono or poly glycidyl acrylate and (meth)acrylic acid.

(Meth)acrylate having hydroxy group in a semiester, which is a reaction product of polycarboxylic acid anhydride, as the reactive crosslinking agent (C) is, for example, such as 2-hydroxyethyl (meth)acrylate, 2-hydroxypropyl (meth)acrylate, and 1,4-butandiol mono(meth)acrylate.

Polycarboxylic acid anhydride is, for example, such as succinic anhydride, maleic anhydride, phthalic anhydride, tetrahydrophthalic anhydride and hexahydrophthalic anhydride.

Mono or poly glycidyl compound in epoxy (meth)acrylate, which is a reaction product of mono or poly glycidyl compound and (meth)acrylic acid, as the reactive crosslinking agent (C) is, for example, such as butyl glycidyl ether, phenyl glycidyl ether, polyethylene glycol diglycidyl ether, polypropylene glycol diglycidyl ether, 1,6-hexanediol diglycidyl ether, hexahydrophthalic acid diglycidyl ester, glycerin polyglycidyl ether, glycerin polyethoxyglycidyl ether, trimethylolpropane polyglycidyl ether and trimethylol propane polyethoxypolyglycidyl ether.

Content of a reactive crosslinking agent (C) is in the range of 2 to 40% by weight and preferably in the range of 3 to 30% by weight wherein the solid part of the photosensitive resin composition is 100%.

Curing component (D) used for the photosensitive resin composition of the present invention as an optional component is such as an epoxy compound and an oxazine compound. Curing component (D) reacts with carboxyl group remained in the coated resin film after light curing by heating and it is especially preferred when farther strong chemical resistant coated resin film is needed.

Specific example of the epoxy compound as curing component (D) includes such as phenol novolac type epoxy resin, cresol novolac type epoxy resin, trishydroxyphenylmethane type epoxy resin, dicyclopentadiene phenol type epoxy resin, bisphenol A type epoxy resin, bisphenol F type epoxy resin, biphenol type epoxy resin, bisphenol A novolac type epoxy resin, an epoxy resin having naphthalene skeleton and heterocyclic epoxy resin.

Phenol novolac type epoxy resin is, for example, Epicron N-770 (Dainippon Ink Chemical Industries Co., Ltd.), D. E. N438 (manufactured by Dow Chemical Co., Ltd.), Epicoat 154 (manufactured by Japan Epoxy Resin Co., Ltd.), and RE-306 (manufactured by Nippon Kayaku Co., Ltd.).

Cresol novolac type epoxy resin is, for example, Epicron-695 (manufactured by Dainippon Ink Chemical Industries Co., Ltd.), EOCN-102S, EOCN-103S and EOCN-104S (manufactured by Nippon Kayaku Co., Ltd.), UVR-6650 (manufactured by Union Carbide Co., Ltd.), and ESCN-195 (manufactured by Sumitomo Chemical Industries Co., Ltd.).

Trishydroxyphenylmethane type epoxy resin is, for example, EPPN-503, EPPN-502H and EPPN-501H (manufactured by Nippon Kayaku Co., Ltd.), TACTIX-742 (manufactured by Dow Chemical Co., Ltd.), and Epicoat E1032H60 (manufactured by Japan Epoxy Resin Co., Ltd.).

Dicyclopentadiene phenol type epoxy resin is, for example, Epicron EXA-7200 (manufactured by Dainippon Ink Chemical Industries Co., Ltd.), and TACTIX-556 (manufactured by Dow Chemical Co., Ltd.).

Bisphenol type epoxy resin is, for example, bisphenol A type epoxy resin such as Epicoat 828 and Epicoat 1001 (manufactured by Japan Epoxy Resin Co., Ltd.), UVR-6410 (manufactured by Union Carbide Co., Ltd.), D. E. R-331 (manufactured by Dow Chemical Co., Ltd.) and YD-8125 (manufactured by Toto Kasei Co., Ltd.); and bisphenol F type epoxy resin such as UVR-6490 (manufactured by Union Carbide Co., Ltd.) and YDF-8170 (manufactured by Toto Kasei Co., Ltd.).

Biphenol type epoxy resin is, for example, biphenol type epoxy resin such as NC-3000 and NC-3000H (manufactured by Nippon Kayaku Co., Ltd.); bixylenol type epoxy resin such as YL-6121 (manufactured by Japan Epoxy Resin Co., Ltd.); and the like.

Bisphenol A novolac type epoxy resin is, for example, Epicron N-880 (manufactured by Dainippon Ink Chemical Industries Co., Ltd.) and Epicoat E157S75 (manufactured by Japan Epoxy Resin Co., Ltd.), and YX-8000 (manufactured by Japan Epoxy Resin Co., Ltd.) also can be employed.

Epoxy resin having naphthalene skeleton is, for example, such as NC-7000 and NC-7300 (manufactured by Nippon Kayaku Co., Ltd.); and EXA-4750 (manufactured by Dainippon Ink Chemical Industries Co., Ltd.).

Cyclic epoxy resin is, for example, such as EHPE-3150 (manufactured by Daicel Chemical Industries Co., Ltd.). Heterocyclic epoxy resin is, for example, such as TEPIC-L, TEPIC-H and TEPIC-S (manufactured by Nissan Chemical Industries Co., Ltd.).

Oxazin compound as curing component (D) is, for example, such as B-m type benzoxazine, P-a type benzoxazine and B-a type benzoxazine (manufactured by Shikoku Chemical Industries Co., Ltd.).

Curing component (D) is preferably NC-3000 or YX-4000 which is biphenol type epoxy resin; and TEPIC-L, TEPIC-H or TEPIC-S which is heterocyclic epoxy resin.

Content ratio of curing component (D) is preferably not more than 200% equivalent calculated from the solid-component acid value and quantity consumed of urethane resin (A) soluble in aqueous alkali solution of the present invention. If the amount is more than 200%, developing property of the photosensitive resin composition of the present invention not preferably decreases extremely.

Further, according to need, such as various fillers and additives; for example, a filler such as talc, barium sulfate, calcium carbonate, magnesium carbonate, barium titanate, aluminum hydroxide, aluminum oxide, silica and clay; thixotropic agent such as aerosil; coloring agent such as phthalocyanine blue, phthalocyanine green and titanium oxide; and leveling agent and antifoaming agent such as silicone and fluoride type compound; polymerization inhibitor such as hydroquinone and hydroquinone monometbyl ether can be added to increase various properties of the composition.

Further, such as melamine can be added as a thermal curing catalyst.

Specifically when above curing component (D) is used, it can be premixed into the resin composition or mixed prior to coating to a print wiring board. Specifically two kinds of solution which are the main solution including mainly (A) component and a promoter for epoxy curing, and curing solution including mainly curing component (D) can be mixed prior to use. In this case, B and C components can be added adequately to the main solution or to the curing solution for use. A solvent used to make the solution can be the same solvent as used to synthesize urethane resin (A) soluble in aqueous alkali solution or another solvent disclosed as an example for urethanization reaction solvent can be used in separate or in mixing.

The photosensitive resin composition of the present invention can be used as a dry-film type solder mask having a sandwich structure in which the resin composition is sandwiched between a support film and a protection film.

The photosensitive resin composition (liquid or film) of the present invention not only is useful for an insulation material of electronic part; a solder mask for a light guide and a print base board which is connecting between light parts; and a resist material for such as a cover ray; but also can be used as a color filter, a printing ink, a sealant, a coating agent, and an adhesive.

The present invention includes a method of curing product which cures by irradiation of actinic energy rays such as ultraviolet light to the photosensitive resin composition. The curing by irradiation of actinic energy rays such as ultraviolet light can be carried out as usual. For example, when ultraviolet light is irradiated, an ultraviolet light means such as a low-pressure mercury lamp, a high-pressure mercury lamp, an ultrahigh-pressure mercury lamp, a xenon lamp, and an ultraviolet emission laser (such as an excimer laser) can be used.

The curing product of the photosensitive resin composition of the present invention can be used for a base material, for example, such as a resist film; a print base board as an insulation film between layers for a build-up method or a light guide; and an electric part, an electronic part and a light part such as a light electronic board or a light board. Specific example having these base materials is, for example, a home electronic product such as a computer and a liquid display, and portable equipment such as a cellular telephone.

A thickness of this curing product layer is approximately in the range of 0.5 to 160 µm and preferably in the range of 1 to 100 µm.

The present invention includes manufacturing methods of the solder mask for flexible print wiring board, the insulation film between layers for multilayer print wiring board or the photosensitive light guide, which comprise steps of, coating of the photosensitive resin composition of the present invention; curing by irradiation of actinic energy rays; and processing with alkali treatment and/or thermal treatment. For example, we explain specifically about the flexible print wiring board. When a liquid resin composition is used, the photosensitive resin composition of the present invention is coated with the film thickness in the range of 0.5 to 160 µm using such as a screen printing method, a spray method, a roll coat method, a static electric coating method, a curtain coat method, and is dried at normally in the range of 50 to 110° C. and preferably in the range of 60 to 100° C.

Then, an actinic energy ray such as ultraviolet light is irradiated directly or indirectly to the coating film through the photomask forming an exposure pattern of such as negative film, of which the strength is approximately in the normal range of 10 to 200 mJ/cm$^2$, and then unexposed part is developed by such as spraying, immersing with shaking, brushing, and scrapping using a developing solution, which is explained later. If it is necessary, an actinic energy ray such as ultraviolet light is irradiated and then it is treated normally at temperature in the range of 100 to 200° C. and preferably in the range of 140 to 180° C. to give a print wiring board having a permanent protective film with an excellent gold plating property and satisfactory anti-warping property, high insulation property, heat resistance, chemical resistance, acid resistance, adhesion property, and bending property.

Aqueous alkali solution used for development is an inorganic aqueous solution of such as potassium hydroxide, sodium hydroxide, sodium carbonate, potassium carbonate, sodium bicarbonate, potassium bicarbonate, sodium phosphate and potassium phosphate; and an organic aqueous alkali solution of such as tetramethylammonium hydroxide, tetraethylammonium hydroxide, tetrabutylammonium hydroxide, monoethanolamine, and diethanolamine.

EXAMPLES

According to the examples, we explain specifically the present invention, but not limited to the present examples.

Synthetic Example 1

508.52 g (1.000 mole) of Kayarad R-115 (manufactured by Nippon Kayaku Co., Ltd., bisphenol A type epoxy acrylate, Molecular weight 508.52), diol compound (b) having the ethylenically unsaturated group in its molecule; 134.93 g (1.006 mole) of dimethylol propionic acid, diol compound (c) having the carboxyl group in its molecule; 297.26 g (1.337 mole) of isophorone diisocyanate, diisocyanate compound (a); 561.04 g of diethylene glycol monoethyl ether acetate, solvent; and 4.81 g of 2,6-di-tert-butyl-p-cresol, thermal polymerization inhibitor; were mixed in a 2 L flask with 4 necks; and the mixture was reacted for 3 hours at 60° C. and for 4 hours at 80° C. until absorbance at about 2250 cm$^{-1}$ of IR (Infrared) spectrum disappeared. After reaction, the solid-component acid value was 60 mgKOH/g. To this reaction solution, 101.22 g (0.665 mole) of tetrahydrophthalic anhydride as a cyclic acid anhydride (e) and 0.16 g of 4-dimethylaminopyridine as a catalyst were added and the mixture was reacted for 4 hours at 95° C. to give the resin solution containing 65% by weight of urethane resin (A) soluble in aqueous alkali solution. This resin solution is referred as A-1. The acid value measured was 59 mgKOH/g (the solid-component acid value; 91 mgKOH/g).

Synthetic Example 2

540.18 g (1.000 mole) of Kayarad R-9467 (manufactured by Nippon Kayaku Co., Ltd., bisphenol A type epoxy acrylate, Molecular weight 540.18), diol compound (b) having the ethylenically unsaturated group in its molecule; 139.20 g (1.038 mole) of dimethylol propionic acid, diol compound (c) having the carboxyl group in its molecule; 100.66 g (0.453 mole) of isophorone diisocyanate and 190.43 g (0.906 mole) of trimethylhexamethylene diisocyante, diisocyanate compound (a); 578.76 g of diethylene glycol monoethyl ether acetate, solvent; and 4.81 g of 2,6-di-tert-butyl-p-cresol, thermal polymerization inhibitor; were mixed in a 2 L flask with 4 necks; and the mixture was reacted for 3 hours at 60° C. and for 4 hours at 80° C. until absorbance at about 2250 cm$^{-1}$ of IR spectrum disappeared. After reaction, the solid-component acid value was 60 mgKOH/g. To this reaction solution, 104.37 g (0.686 mole) of tetrahydrophthalic anhydride as a cyclic acid anhydride (e) and 0.16 g of 4-diemthylaminopyridine as a catalyst were added and the mixture was reacted for 4 hours at 95° C. to give the resin solution containing 65% by weight of urethane resin (A) soluble in aqueous alkali solution. This resin solution is referred as A-2. The acid measured value was 58 mgKOH/g (the solid-component acid value: 89 mgKOH/g).

Synthetic Example 3

508.52 g (1.000 mole) of Kayarad R-115 (manufactured by Nippon Kayaku Co., Ltd., bisphenol A type epoxy acrylate, Molecular weight 508.52), diol compound (b) having the ethylenically unsaturated group in its molecule; 104.88 g (0.782 mole) of dimethylol propionic acid, diol compound (c) having the carboxyl group in its molecule; 264.06 g (1.188 mole) of isophorone diisocyanate, diisocyanate compound (a); 510.76 g of diethylene glycol monoethyl ether acetate, solvent; and 4.81 g of 2,6-di-tert-butyl-p-cresol, thermal polymerization inhibitor; were mixed in a 2 L flask with 4 necks; and the mixture was reacted for 3 hours at 60° C. and for 4 hours at 80° C. until absorbance at about 2250 cm$^{-1}$ of IR spectrum disappeared. After reaction, the solid-component acid value was 50 mgKOH/g. To this reaction solution, 71.09 g (0.370 mole) of trimellitic anhydride as a cyclic acid anhydride (e) and 0.16 g of 4-dimethylaminopyridine as a catalyst were added and the mixture was reacted for 4 hours at 95° C. to give the resin solution containing 65% by weight of urethane resin (A) soluble in aqueous alkali solution. This resin solution is referred as A-3. The acid value measured was 60 mgKOH/g (the solid-component acid value: 92 mgKOH/g).

Synthetic Example 4

540.18 g (1.000 mole) of Kayarad R-9467 (manufactured by Nippon Kayaku Co., Ltd., bisphenol A type epoxy acrylate, Molecular weight 540.18), diol compound (b) having the ethylenically unsaturated group in its molecule; 261.38 g (1.949 mole) of dimethylol propionic acid, diol compound (c) having the carboxyl group in its molecule; 413.35 g (1.966 mole) trimethylhexamethylene diisocyanate, diisocyanate compound (a); 678.49 g of diethylene glycol monoethyl ether acetate, solvent; and 5.0 g of 2,6-di-tert-butyl-p-cresol, thermal polymerization inhibitor; were mixed in a 2 L flask with 4 necks; and the mixture was reacted for 3 hours at 60° C. and for 4 hours at 80° C. until absorbance at about 2250 cm$^{-1}$ of IR spectrum disappeared. After reaction, the solid-component acid value was 90 mgKOH/g. To this reaction solution, 45.14 g (0.297 mole) of tetrahydrophthalic anhydride as a cyclic acid anhydride (e), and 0.15 g of 4-diemthylaminopyridine as a catalyst were added and the mixture was reacted for 4 hours at 95° C. to give the resin solution containing 65% by weight of urethane resin (A) soluble in aqueous alkali solution. This resin solution is referred as A-4. The acid value measured was 66 mgKOH/g (the solid-component acid value: 102 mgKOH/g).

Synthetic Example 5

512.12 g (1.000 mole) of Kayarad R-9451 (manufactured by Nippon Kayaku Co., Ltd., bisphenol A type epoxy acrylate, Molecular weight 512.12), diol compound (b) having the ethylenically unsaturated group in its molecule; 508.01 g (3.429 mole) of dimethylol butanoic acid, diol compound (c) having the carboxyl group in its molecule; 101.26 g (0.857 mole) of 1,6-hexanediol, diol compound (d) not having any ethylenically unsaturated group or carboxylic group in its molecule; 903.77 g (4.066 mole) of isophorone diisocyanate, diisocyanate compound (a); 1350.11 g of diethylene glycol monoethyl ether acetate, solvent; and 6.87 g of 2,6-di-tert-butyl-p-cresol, thermal polymerization inhibitor; were mixed in a 4 L flask with 4 necks; and the mixture was reacted for 3 hours at 60° C. and for 4 hours at 80° C. until absorbance at about 2250 cm$^{-1}$ of IR spectrum disappeared. After reaction, the solid-component acid value was 95 mgKOH/g. To this reaction solution, 37.63 g (0.247 mole) of tetrahydrophthalic anhydride as a cyclic acid anhydride (e) and 25.09 g of diethylene glycol monoethyl ether acetate as a solvent were added and the mixture was reacted for 4 hours at 95° C. to give the resin solution containing 60% by weight of urethane resin (A) soluble in aqueous alkali solution. This resin solution is referred as A-5. The acid value measured was 60 mgKOH/g (the solid-component acid value: 100 mgKOH/g).

Synthetic Example 6

368.0 g of RE 310S (manufactured by Nippon Kayaku Co., Ltd., bifunctional bisphenol A type epoxy resin, the epoxy equivalent 184 g/equivalent), bisphenol A type epoxy resin; 172.2 g of methacrylic acid (Molecular weight 86.09); 4.37 g of 2,6-di-tert-butyl-p-cresol, thermal polymerization inhibitor; and 1.62 g of triphenyl phosphine, reaction catalyst; were mixed in 3 L flask attached with stirring device and reflux condenser, and were reacted at 98° C. until the acid value of the reaction solution became not more than 0.5 mgKOH/g to give diol compound (b) having the ethylenically unsaturated group in its molecule (Theoretical molecular weight: 540.18).

Then, 757.4 g of carbitol acetate, reaction solvent; and 319.4 g of dimethylol propionic acid (Molecular weight 134.16), diol compound (c) having the carboxy group in its molecule; were added to this reaction solution and temperature was raised to 45° C. 546.9 g of trimethylhexamethylene diisocyanate (Molecular weight 210.27) was gradually dropped to this solution as the reaction temperature was maintained under 65° C. After dropping, the temperature was raised to 80° C. and the reaction was continued for 6 hours until the absorbance at approximately 2250 cm$^{-1}$ of IR spectrum disappeared.

And then, 15.3 g of succinic anhydride (Molecular weight 100.07), cyclic acid anhydride; and 8.25 g of carbitol acetate, reaction solvent; were added and reacted for 3 hours at 98° C. to give the resin solution containing 65% by weight of urethane resin (A) soluble in aqueous alkali solution. (This solution is referred as A-6.) The acid value measured was 63.0 mgKOH/g (the solid-component acid value: 96.9 mgKOH/g).

Synthetic Example 7

368.0 g of RE 310S (manufactured by Nippon Kayaku Co., Ltd., bifunctional bisphenol A type epoxy resin, the epoxy equivalent 184 g/equivalent), a bisphenol A type epoxy resin; 172.2 g of methacrylic acid (Molecular weight 86.09); 4.37 g of 2,6-di-tert-butyl-p-cresol, thermal polymerization inhibitor; and 1.62 g of triphenyl phosphine, reaction catalyst; were mixed in a 3 L flask attached with stirring device and reflux condenser, and were reacted at 98° C. until the acid value of the reaction solution became not more than 0.5 mgKOH/g to give diol compound (b) having the ethylenically unsaturated group in its molecule. (Theoretical molecular weight: 540.18)

Then, 654.2 g of carbitol acetate, reaction solvent; and 261.4 g of dimethylol propionic acid (Molecular weight 134.16), diol compound (c) having the carboxy group in its molecule; were added to this reaction solution and temperature was raised to 45° C. 413.4 g of trimethylhexamethylene diisocyanate (Molecular weight 210.27) was gradually dropped to this solution as the reaction temperature was maintained under 65° C. After dropping, the temperature was raised to 80° C. and the reaction was continued for 6 hours until the absorbance at approximately 2250 cm$^{-1}$ of IR spectrum disappeared.

And then, 26.4 g of succinic anhydride (Molecular weight 100.07), cyclic acid anhydride; and 14.2 g of carbitol acetate, reaction solvent; were added and reacted for 3 hours at 98° C. to give the resin solution containing 65% by weight of urethane resin (A) soluble in aqueous alkali solution. (This solution is referred as A-7.) The acid value measured was 64.3 mgKOH/g (the solid-component acid value: 98.9 mgKOH/g).

Example 1

A photosensitive resin composition was accomplished by mixing with A-1 obtained in synthetic example 1 in the ratio shown in Table 1 and kneading with 3-roll mill. This was coated on a print board by screen printing method to give 15 to 25 µm of dried film thickness and then the film was dried for 30 minutes with hot air at 80° C. Then, ultraviolet light was irradiated through a mask on which circuit pattern was drawn using ultraviolet light exposure device (Oak Manufacturing Co., Ltd., Model HMW-680GW). And then, spraying development was carried out with 1% of aqueous sodium carbonate solution and the resin of ultraviolet light not-irradiated part was removed (development). After washing with water and drying, the print board was heated and cured by hot air dryer with 150° C. to give a cured film. As described in test examples later, the cured product was tested on photosensitivity, surface glazing, base board warping, bending property, adhesion property, pencil hardness, solvent resistance, acid resistance, heat resistance, and gold plating resistance. The results are shown in Table 2.

Example 2

A photosensitive resin composition was accomplished by mixing with A-2 obtained in synthetic example 2 in the ratio shown in Table 1 and kneading with 3-roll mill. This was coated on a print board by screen printing method to give1 15 to 25 µm of dried film thickness and then the film was dried for 30 minutes with hot air at 80° C. Then, ultraviolet light was irradiated through a mask on which circuit pattern was drawn using ultraviolet light exposure device (Oak Manufacturing Co., Ltd., Model HMW-680GW). And then, spraying development was carried out with 1% of aqueous sodium carbonate solution and the resin of ultraviolet light not-irradiated part was removed (development). After washing with water and drying, the print board was heated and cured by hot air dryer with 150° C. to give a cured film. As shown in test examples later, each property test was carried out. The results are shown in Table 2.

Example 3

54.44 g of resin solution A-3 obtained in synthetic example 3; 3.54 g of HX-220 (manufactured by Nippon Kayaku Co., Ltd., bifunctional acrylate resin), reactive crosslinking agent (C); 4.72 g of Irgacure 907 (manufactured by Vantico Co., Ltd., photo polymerization initiator) and 0.47 g of Kayacure DETX-S (manufactured by Nippon Kayaku Co., Ltd., photopolymerization initiator), photopolymerization initiator (B); 14.83 g of YX-8000 (manufactured by Japan Epoxy Resin Co., Ltd., bifunctional hydrogenated bisphenol A type epoxy resin, the epoxy equivalent 202.06 g/equivalent), curing component (D); 1.05 g of melainine, heat curing catalyst; and 20.95 g of methyl ethyl ketone, concentration adjusting solvent; were mixed with bead mill to suspend homogeneously giving the photosensitive resin composition.

The composition obtained was coated homogeneously on the polyethylene terephthalate film, which was a supporting film, by the roll coat method, and was passed through hot air drying oven at 70° C. to form the resin layer having 30 µm thickness, and then polyethylene film as a protective film was attached on the resin layer to give a dry film. The resin layer of the dry film obtained was attached on whole polyimide print base board (cupper circuit thickness: 12 µm, polyimide film thickness: 25 µm) by heating roll at 80° C. while peeling off the protective film.

Then, ultraviolet light was irradiated by using ultraviolet light reduced projection exposure device in which negative mask having light guide pattern was installed (volume irradiated: 500 mJ/cm$^2$).

After irradiation, the supporting film was peeled off from the resin and was developed with 0.25% aqueous tetramethylammonium solution for 30 seconds to dissolve and remove undeveloped parts. After washing with water and drying, the print base board was heated and cured for 30 minutes by hot air drying device at 150° C. to give a curing film. Clearness of the curing product obtained was good and 50 µm pattern was resolved.

Examples 4 and 5

A photosensitive resin composition of the present invention was accomplished by mixing with A-6 or A-7 obtained in synthetic example 6 or 7 in the ratio shown in Table 1, and kneading with 3-roll mill. This was coated on a print board by screen printing method to give 15 to 25 µm of dried film thickness and then the film was dried for 30 minutes with hot air at 80° C. Then, ultraviolet light was irradiated through a mask on which circuit pattern was drawn using ultraviolet light exposure device (Oak Manufacturing Co., Ltd., Model HMW-680GW). And then, spraying development was carried out with 1% of aqueous sodium carbonate solution and the resin of ultraviolet light not-irradiated part was removed (development). After washing with water and drying, the print board was heated and cured by hot air dryer with 150° C. to give a cured film. As described in test examples later, the cured product was tested on photosensitivity, surface glazing, base board warping, bending property, adhesion property, pencil hardness, solvent resistance, acid resistance, heat resistance, and gold plating resistance. The results are shown in Table 2.

TABLE 1

Composition of photosensitive resin composition

|  |  | Remark | Example 1 | Example 2 | Example 4 | Example 5 |
|---|---|---|---|---|---|---|
| Resin solution | A-1 |  | 51.80 |  |  |  |
|  | A-2 |  |  | 51.80 |  |  |
|  | A-6 |  |  |  | 51.80 |  |
|  | A-7 |  |  |  |  | 51.80 |
| Reactive crosslinking agent | DPCA-60 | 1 | 3.38 |  | 3.38 |  |
| (C) | HX-220 | 2 |  | 3.38 |  | 3.38 |
| Photopolymerization | Irgacure 907 | 3 | 4.50 | 4.50 | 4.50 | 4.50 |
| initiator (B) | DETX-S | 4 | 0.45 | 0.45 | 0.45 | 0.45 |
| Curing component (D) | YX-4000 | 5 | 17.62 | 17.62 |  |  |
|  | NC-3000 | 6 |  |  | 17.62 | 17.62 |
| Heat curing catalyst | Melamine |  | 1.00 | 1.00 | 1.00 | 1.00 |
| Filler and others | Barium sulfate |  | 15.15 | 15.15 | 15.15 | 15.15 |
|  | Phthalocyanine blue |  | 0.45 | 0.45 | 0.45 | 0.45 |
| Additive | BYK-354 | 7 | 0.39 | 0.39 | 0.39 | 0.39 |
|  | KS-66 | 8 | 0.39 | 0.39 | 0.39 | 0.39 |
| Solvent | CA | 9 | 4.87 | 4.87 | 4.87 | 4.87 |

Remark:

1 Nippon Kayaku Co., Ltd.    dipentaerythritol hexaacrylate modified by ε-caprolactone
2 Nippon Kayaku Co., Ltd.    hydroxypivalic acid neopentylglycol diacrylate modified by ε-caprolactone

TABLE 1-continued

| Composition of photosensitive resin composition | | |
|---|---|---|
| 3 | Vantico Co., Ltd. | 2-methyl-1-(4-(methylthio)phenyl)-2- morphorinopropan-1-one |
| 4 | Nippon Kayaku Co., Ltd. | Kayacure DETX-S, 2,4-diethylthioxantone |
| 5 | Japan Epoxy Resin Co., Ltd. | Bifunctional bixylenol type epoxy resin |
| 6 | Nippon Kayaku Co., Ltd. | Bifunctional biphenol type epoxy resin |
| 7 | Bic Chemi Co., Ltd. | Leveling agent |
| 8 | Shin'etsu Chemicals Co., Ltd. | Anti-foaming agent |
| 9 | Osaka Organics Co., Ltd. | Carbitol acetate (solvent) |

Comparison Example

To produce the photopolymerization resin composition disclosed in examples of reference patent 5 (JP Laid Open Patent H9-52925), we tried to synthesize the resin disclosed in synthetic example 1 of the same patent.

48.45 g of YD-128 (manufactured by Toto Kasei Co., Ltd., the epoxy equivalent 186.3), bisphenol A type epoxy resin; 18.66 g of acrylic acid; 0.007 g of hydroquinone; 41.97 g of carbitol acetate; and 28.03 g of solvent naphtha; were mixed and dissolved for 30 minutes at 100° C. Then dimethylbenzylamine 0.0704 g was added and temperature was raised to 110° C. while bubbling air, and stirring was continued. After 5 hours, gel formation occurred and the target resin was not obtained.

Test Examples

Test method for each property is shown in the following.
(Tacking property) Rub absorbent cotton on the film, after coating on the base board and drying, to measure tacking property of the film.
O - - - Absorbent cotton was not tacked on the film.
X - - - Cotton waste was tacked on the film.
(Developing property) Use the following benchmarks for evaluation.
O - - - On development; ink was completely removed and development was carried out.
X - - - On development; some part was not developed.
(Image resolution property) Irradiate and expose the coating film after drying, to which 50 µm negative pattern was adhered, with 200 mJ/cm² of total ultraviolet light volume. Then develop it for 60 seconds with 1% aqueous sodium carbonate solution and 2.0 kg/cm² of spraying pressure, and observe microscopically transferred pattern. Use the following benchmarks for evaluation.
O - - - Pattern edge is linear. Resolution was achieved.
X - - - Peel-off occurs or pattern edge is irregular.
(Photosensitivity) Adhere 21 steps Step Tablet (Kodak) to the coating film after dried, irradiate total light volume 500 mJ/cm² of ultraviolet light and expose to ultraviolet light. Then develop it for 60 seconds with 1% aqueous sodium carbonate solution and 2.0 kg/cm² of spraying pressure, and count steps of coating film remained without being developed.
(Surface glazing) Irradiate total light volume 500 mJ/cm² of ultraviolet light to the coating film after dried and expose to ultraviolet light. Then develop it for 60 seconds with 1% aqueous sodium carbonate solution and 2.0 kg/cm² of spraying pressure, and observe the cured film. Use the following benchmarks for evaluation.
O - - - Absolutely not cloudy
X - - - More or less cloudy
(Base board warping) Use the following benchmarks for evaluation.
O - - - No warp on the base board
Δ - - - Base board warp very slightly is observed.
X - - - Base board warp is observed.
(Bending property) Bend the curing film 180 degree and observe. Use the following benchmarks for evaluation.
O - - - No crack up on the film surface
X - - - Film is cracked up.
(Adhesion property) As directed to JIS K5400, gridiron the test piece with 1 mm width to make 100 grids and use Scotch tape (R) to carry out peeling-off test. Observe peel-off of grid and use the following benchmarks for evaluation.
O - - - No peeling-off
X - - - Peeling-off is observed.
(Pencil hardness) Evaluate as directed to JIS K5400.
(Solvent resistance) Immerse the test piece in isopropyl alcohol for 30 minutes at room temperature. Ensure no abnormality on exterior appearance and then carry out peeling test using Scotch tape (R). Use the following benchmarks for evaluation.
O - - - No abnormality, no swelling and no peeling-off on exterior appearance of the coating film
X - - - Swelling and peeling-off of the coating film are observed.
(Acid resistance) Immerse the piece for 30 minutes in 10% aqueous hydrogen chloride solution. Ensure no abnormality on exterior appearance and then carry out peeling test using Scotch tape (R). Use the following benchmarks for evaluation.
O - - - No abnormality, no swelling and no peeling-off on exterior appearance of the coating film
X - - - Swelling and peeling-off of the coating film are observed.
(Heat resistance) Coat rosin-type plux on the test piece and immerse for 5 seconds in fused solder bath at 260° C. Repeat the same process three times. After cooling down to room temperature and carry out peeling-off test using Scotch tape (R). Use the following benchmarks for evaluation.
O - - - No abnormality, no swelling and no peeling-off on exterior appearance of the coating film
X - - - Swelling and peeling-off on the coating film are observed.
(Gold plating resistance) Immerse a test piece of the base board in acidic defating solution (Nihon MacDiarmid Co. Ltd., 20% by volume aqueous solution of Metex L-5B) for 3 minutes at 30° C.; then wash with water; immerse in 14.4% by weight aqueous ammonium persulfate solution at room temperature for 3 minutes; wash with water; immerse the test piece in 10% by volume aqueous hydrogen sulfate solution for 1 minute; and wash with water. Immerse this base board in a catalyst solution (made by Meltex Co., Ltd., 10% by volume aqueous solution of metal plate activator 350) for 7 minutes at 30° C., wash with water, immerse in nickel plating solution (manufactured by Meltex Co., Ltd., 20% by volume aqueous solution of Melplate Ni-865M, pH 4.6) for 20 minutes at 85° C. to carry out nickel plating, and then immerse in 10% by volume aqueous hydrogen sulfate solution for 1 minute at room temperature and wash with water. Then, immerse the test piece in gold plating solution (manufactured by Meltex Co., Ltd., 15% by volume Aurolectroless UP and 3% by volume aqueous potassium gold cyanide, pH 6) for 10 minutes at 95° C. to carry out electroless gold plating, wash with water, immerse in wann water at 60° C. for 3 minutes, wash with water, and dry it. Adhere Scotch tape to the electroless gold plating evaluation base board and peel off the tape. Observe the condition.

O - - - No abnormality

X - - - More or less there is peeling-off.

(PCT property resistance) Stand a test base board in water for 96 hours under 2 atmospheric pressures at 121° C.; ensure no abnormality on exterior appearance, and carry out peeling-off test using Scotch tape (R) and use the following benchmarks for evaluation.

O - - - No abnormality, no swelling and no peeling-off on exterior appearance of the coating film X - - - Swelling and peeling-off of the coating film are observed.

(Heat and shock resistance) Repeatedly treat a test piece for 30 minutes at −55° C. and for 30 minutes at 125° C. and after 1000 times repeated, observe microscopically the test piece and use the following benchmarks for evaluation.

O - - - No crack observed on the coating film

X - - - There is a crack observed on the coating film.

TABLE 2

| Test Term | Test Results | | | |
|---|---|---|---|---|
| | Example 1 | Example 2 | Example 4 | Example 5 |
| Tacking property | O | O | O | O |
| Developing property | O | O | O | O |
| Image resolution property | O | O | O | O |
| Photosensitivity | 10 | 10 | 10 | 11 |
| Surface glazing | O | O | O | O |
| Base board warping | O | O | O | O |
| Bending property | O | O | O | O |
| Adhesion property | O | O | O | O |
| Pencil hardness | 5 H | 4 H | 4 H | 5 H |
| Solvent resistance | O | O | O | O |
| Acid resistance | O | O | O | O |
| Heat resistance | O | O | Δ | O |
| Gold plating resistance | O | O | O | O |
| PCT property resistance | O | O | O | O |
| Heat and shock resistance | O | O | O | O |

The above results obviously showed that the polyurethane compound soluble in aqueous alkali solution and the photosensitive resin composition using it of the present invention had no tacking property; was highly photosensitive; the curing film thereof was hot solder resistant, chemical resistant, gold plating resistant, had excellent properties such as high insulation property; no crack on the surface of the curing material occurred; if the base board like thin film was used, that was the photosensitive resin composition for the print base board without warp on the base board.

The polyurethane compound soluble in aqueous alkali solution produced without any catalyst and to which an acid was added, and the photosensitive resin composition thereof has an excellent photosensitivity in the formation of photo-exposure cured coating film by actinic energy rays, has an excellent photosensitivity to actinic energy rays to obtain a fine image corresponding to a high function print wiring board, can form a pattern by developing with a diluted aqueous alkali solution, and the cured film obtained by post curing processing with heat according to need has satisfactory flexibility, bending property, adhesion property, pencil hardness, chemical resistance, acid resistance, heat resistance, gold plating resistance, electroless gold plating resistance, tin plating resistance and high insulation property. Especially it is appropriate to produce a solder mask for flexible print wiring board, an insulation film between layers for multi layer print wiring board and a light guide.

What is claimed is:

1. A photosensitive resin composition comprising:
   urethane resin soluble in aqueous alkali solution, said urethane resin obtained by first reacting a diisocyanate compound, a first diol compound having an ethylenically unsaturated group, a second diol compound having a carboxyl group, and a third diol compound not having any ethylenically unsaturated group or carboxyl group as an optional component without any catalyst; and then reacting the alcoholic hydroxy group of the reaction product of the first reaction with a cyclic acid anhydride selected from (a) a dibasic acid monoanhydride in which the dibasic acid forms an intramolecular acid anhydride, (b) a tribasic acid monoanhydride in which two carboxylic groups of the tribasic acid form an intramolecular anhydride, or a mixture of (a) and (b);
   a photo polymerization initiator; and
   a reactive cross-linking agent.

2. The photosensitive resin composition according to claim 1 comprising:
   a curing component as an optional component.

3. The photosensitive resin composition according to claim 1,
   wherein the solid-component acid value of said urethane resin is in the range of 30 to 150 mgKOH/g.

4. The photosensitive resin composition according to claim 1, wherein said diisocyanate compound is isophorone diisocyanate and/or trimethylhexamethylene diisocyanate;
   said first diol compound having the ethylenically unsaturated group is the reaction product of an epoxy resin of bisphenol A and methacrylic acid;
   said second diol compound having the carboxyl group is dimethylol propionic acid; and
   said cyclic acid anhydride is succinic anhydride.

5. The photosensitive resin composition according to claim 4,
   wherein the epoxy equivalent of said epoxy resin of bisphenol A is in the range of 100 to 900 g/equivalent.

6. The photosensitive resin composition according to claim 1,
   wherein said urethane resin soluble in aqueous alkali solution is obtained by adding trimethylhexamethylene diisocyanate to a mixture of dimethylol propionic acid and a reaction product of an epoxy resin of bisphenol A and methacrylic acid, and then reacting with succinic anhydride.

7. The photosensitive resin composition according to claim 6,
wherein an equivalent ratio, in the reaction to obtain the urethane resin (A) soluble in aqueous alkali solution, of a hydroxyl group in a mixture of dimethylol propionic acid and the reacted product of an epoxy resin of bisphenol A and methacrylic acid, to isocyanate group of trimethylhexamethylene diisocyanate is in the range of 1.1 to 2.0.

8. A manufacturing method of a cured product comprising:
irradiating actinic energy rays on the photosensitive resin composition according to claim 1.

9. A base material having a layer of the cured product produced by the manufacturing method according to claim 8.

10. A product having the base material according to claim 9.

11. A photosensitive resin composition according to claim 1, wherein the diisocyanate compound comprises:
phenylene diisocyanate, tolylene diisocyanate, xylylene diisocyanate, tetramethylxylylene diisocyanate, diphenylmethane diisocyanate, naphthalene diisocyanate, toludene diisocyanate, hexamethylene diisocyanate, dicyclohexylmethane diisocyanate, isophorone diisocyanate, allylenesulfonether diisocyanate, allylcyan diisocyanate, N-acyl diisocyanate, trimethylhexamethylene diisocyanate, 1,3-bis-(isocyanatomethyl)cyclohexane and norbornan diisocyanate.

12. A photosensitive resin composition according to claim 1, wherein the first diol compound is a reaction product of an epoxy compound having two epoxy groups and (meth)acrylic acid or cinnamic acid, or a reaction product of an epoxy resin of bisphenol A or an epoxy resin of hydrogenated bisphenol A and (meth)acrylic acid.

13. A photosensitive resin composition according to claim 12, wherein the epoxy compound comprises:
a phenyl diglycidyl ether, an epoxy compound of bisphenol, an epoxy compound of hydrogenated bisphenol, an epoxy compound of halogenated bisphenol, an acyclic diglycidyl ether compound, an aliphatic diglycidyl ether, a polysulfide diglycidyl ether, or an epoxy resin of biphenol.

14. A photosensitive resin composition according to claim 1, wherein the first diol compound comprises a reaction product of dimethylol propionic acid and 2-hydroxethyl (meth)acrylate, a reaction product of dimethylol propionic acid and 2-hydroxypropyl (meth)acrylate, a reaction product of dimethylol butanoic acid and 2-hydroxyethyl (meth)acrylate, a reaction product of dimethylol butanoic acid and 2-hydroxypropyl (meth)acrylate, a reaction product of an epoxy compound having two epoxy groups and (meth)acrylic acid or cinnamic acid, or a reaction product of a phenolic compound having two phenolic hydroxyl groups and glycidyl (meth)acrylate.

15. A photosensitive resin composition according to claim 1, wherein the second diol compound is a compound with two alcoholic hydroxy groups and more than one carboxylic group.

16. A photosensitive resin composition according to claim 1, wherein the second diol compound comprises: dimethylol propionic acid or dimethylol butanoic acid.

17. A photosensitive resin composition according to claim 1, wherein
the third diol compound is an aliphatic diol compound or alicyclic diol compound which has no ethylenically unsaturated group or no carboxyl group, and in which two alcoholic hydroxy groups are not attached to the same carbon.

18. A photosensitive resin composition according to claim 1, wherein the third diol compound comprises:
(poly)ethylene glycol, (poly)propylene glycol, trimethylene glycol, 1,4-butanediol, 1.5-pentanediol, 1,6-hexanediol, 1,7-heptanediol, 1,8-octanediol, 1,9-nonanediol, 1,1 0-decanediol, hydrobenzoin, benzpinacol, cyclopentane- 1,2-diol, cyclohexane- 1,2-diol, cyclohexane-1,4-diol, cyclohexane-1,2-dimethanol, cyclohexane- 1,4-dimethanol, a butadiene-acrylonitrile copolymer having a hydroxy group at its end, a spiro glycol having a hydroxyl group at its end, a dioxane glycol having a hydroxy group at its end, a tricyclodecane dimethanol having a hydroxyl group at its end, a macromonomer having a hydroxyl group at its end and a polystyrene side chain, hydrogenated bisphenol A, hydrogenated bisphenol F, or a reaction product of one of the diol compounds above and an oxide.

19. A photosensitive resin composition according to claim 1, wherein the cyclic acid anhydride comprises:
maleic anhydride, succinic anhydride, itaconic anhydride, phthalic anhydride, tetrahydro phthalic anhydride, hexahydro phthalic anhydride, methyl endmethylene tetrahydro phthalic anhydride, methyltetrahydro phthalic anhydride, trimellitic anhydride, tetrahydro trimellitic anhydride or hexahydro trimellitic anhydride.

20. A photosensitive resin composition according to claim 1, wherein the photo polymerization initiator comprises: a benzoin compound, an acetophenone compound, an anthraquinone compound, a thioxanthone compound, a ketal compound, a benzophenone compound, or a phosphine oxide compound.

21. A photosensitive resin composition according to claim 1, wherein the reactive cross-linking agent is a (meth) acrylate derivative.

22. A photosensitive reasin composition according to claim 1, wherein the reactive cross-linking agent comprises:
2-hydroxyethyl (meth)acrylate, 2-hydroxypropyl (meth)acrylate, 1,4-butanediol-mono(meth)acrylate, carbitol (meth)acrylate, acryloyl morpholine, a semiester which is a reaction product of (meth)acrylate having hydroxy group and polycarboxylic acid anhydride, polyethylene glycol di(meth)acrylate, tripropylene glycol di(meth)acrylate, trimethylol propane polyethoxytri(meth)acrylate, glycerine polypropoxytri(meth)acrylate, di(meth)acrylate which is a reaction product of hydroxylpivalic acid neopentylglycol and ε-caprolactone, pentaerythrytol tetra(meth)acrylate, poly(meth)acrylate which is a reaction product of dipentaerythrytol and ε-caprolatone, or epoxy (meth)acrylate which is a reaction product of mono or poly glycidyl acrylate and (meth) acrylic acid.

* * * * *

UNITED STATES PATENT AND TRADEMARK OFFICE
CERTIFICATE OF CORRECTION

PATENT NO.       : 7,374,862 B2
APPLICATION NO.  : 10/547907
DATED            : May 20, 2008
INVENTOR(S)      : Ryutaro Tanaka et al.

It is certified that error appears in the above-identified patent and that said Letters Patent is hereby corrected as shown below:

In the Title Page: Item [86]

Please delete "371 (c)(1), (2), (4) Date: Sep. 6, 2005" and insert --371 (c)(1) ,(2), (4) Date: November 7, 2005--

Signed and Sealed this

Second Day of December, 2008

JON W. DUDAS
*Director of the United States Patent and Trademark Office*